(12) United States Patent
Wojcik et al.

(10) Patent No.: US 9,318,678 B2
(45) Date of Patent: Apr. 19, 2016

(54) REFLECTO TROUGH FOR AN OPTOELECTRONIC SEMICONDUCTOR COMPONENT

(71) Applicant: OSRAM Opto Semiconductors GmbH, Regensburg (DE)

(72) Inventors: Andreas Wojcik, Regensburg (DE); Martin Haushalter, Regensburg (DE); Frank Möllmer, Matting (DE); Wilhelm Karsten, Regensburg (DE); Heinz Haas, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 14/653,835

(22) PCT Filed: Dec. 16, 2013

(86) PCT No.: PCT/EP2013/076736
§ 371 (c)(1),
(2) Date: Jun. 18, 2015

(87) PCT Pub. No.: WO2014/108277
PCT Pub. Date: Jul. 17, 2014

(65) Prior Publication Data
US 2015/0349222 A1    Dec. 3, 2015

(30) Foreign Application Priority Data
Jan. 8, 2013 (DE) .......................... 10 2013 100 121

(51) Int. Cl.
*H01L 33/38*    (2010.01)
*H01L 33/62*    (2010.01)
(Continued)

(52) U.S. Cl.
CPC ............... *H01L 33/62* (2013.01); *H01L 33/54* (2013.01); *H01L 33/58* (2013.01); *H01L 33/60* (2013.01);
(Continued)

(58) Field of Classification Search
CPC ................... H01L 51/5203; H01L 23/49548; H01L 33/38
USPC ..................................................... 257/98, 676
See application file for complete search history.

(56) References Cited

U.S. PATENT DOCUMENTS 4,964,025 A * 10/1990 Smith ........................ F21K 9/00
257/88
5,001,609 A *  3/1991 Gardner ................ F21S 48/215
257/98
(Continued)

FOREIGN PATENT DOCUMENTS

DE         10345516 A1     5/2005
DE     102005028748 A1     5/2006
(Continued)

OTHER PUBLICATIONS

"Engwinklige LED im MIDLED-Gehäuse (850 nm); Narrow Beam LED in MIDLED Package (850 nm); Lead (Pb) Free Product—RoHS Compliant," OSRAM Opto Semiconductors, Data Sheet SFH 4650, SFH 4655, Mar. 8, 2012, 10 pages.
(Continued)

*Primary Examiner* — George Fourson, III
(74) *Attorney, Agent, or Firm* — Slater & Matsil, L.L.P.

(57) ABSTRACT

An optoelectronic semiconductor component includes a lead frame with two lead frame parts and an optoelectronic semiconductor chip. The semiconductor chip is fitted to a first of the lead frame parts. A radiation-transmissive potting body of the semiconductor component mechanically connects the lead frame parts to one another. The potting body is set up for beam shaping. The first lead frame part has a reflector trough with a base surface on which the semiconductor chip is mounted. The reflector trough has a lateral surface with three sections. When seen in a plan view of the base surface, the sections revolve around the base surface and follow one another in a direction away from the base surface. In the first section, closest to the base surface, the lateral surface is oriented perpendicular to the base surface.

16 Claims, 5 Drawing Sheets

(51) Int. Cl.
*H01L 33/58* (2010.01)
*H01L 33/54* (2010.01)
*H01L 33/60* (2010.01)
H01L 23/495 (2006.01)
H01L 51/52 (2006.01)
H01L 33/48 (2010.01)

(52) U.S. Cl.
CPC ........... *H01L 23/49548* (2013.01); *H01L 33/38* (2013.01); *H01L 33/486* (2013.01); *H01L 51/5203* (2013.01); *H01L 2224/48091* (2013.01); *H01L 2224/48247* (2013.01); *H01L 2224/48465* (2013.01)

(56) References Cited

U.S. PATENT DOCUMENTS

| | | | | |
|---|---|---|---|---|
| 5,040,868 | A * | 8/1991 | Waitl | G02B 6/4202 257/701 |
| 7,718,024 | B2 | 5/2010 | Chang et al. | |
| 7,897,977 | B2 | 3/2011 | Börner et al. | |
| 2002/0072137 | A1* | 6/2002 | Ih | H01L 33/54 438/22 |
| 2003/0001166 | A1* | 1/2003 | Waalib-Singh | H01L 33/60 257/98 |
| 2004/0070337 | A1* | 4/2004 | Goh | H01L 33/60 313/512 |
| 2005/0133939 | A1* | 6/2005 | Chikugawa | H01L 33/60 257/790 |
| 2006/0138440 | A1* | 6/2006 | Jyo | G09F 9/33 257/98 |
| 2006/0157722 | A1 | 7/2006 | Takezawa et al. | |
| 2007/0085103 | A1 | 4/2007 | Nishioka et al. | |
| 2007/0114514 | A1 | 5/2007 | Ito | |
| 2007/0278511 | A1* | 12/2007 | Ohno | H01L 24/32 257/99 |
| 2007/0297179 | A1 | 12/2007 | Leung et al. | |
| 2008/0128724 | A1* | 6/2008 | Isobe | B29C 45/14655 257/98 |
| 2010/0019247 | A1* | 1/2010 | Joichi | H01L 33/32 257/76 |
| 2010/0133565 | A1* | 6/2010 | Cho | H01L 33/62 257/98 |
| 2010/0171139 | A1 | 7/2010 | Muranaka et al. | |
| 2011/0062470 | A1 | 3/2011 | Bierhuizen et al. | |
| 2011/0186865 | A1* | 8/2011 | Chan | H01L 25/0753 257/88 |
| 2011/0309736 | A1 | 12/2011 | Muranaka et al. | |
| 2012/0119230 | A1* | 5/2012 | Chan | G02B 6/0023 257/88 |
| 2012/0120118 | A1 | 5/2012 | Chan et al. | |
| 2012/0161186 | A1 | 6/2012 | Katabe et al. | |
| 2012/0205693 | A1 | 8/2012 | Ong et al. | |
| 2012/0211785 | A1* | 8/2012 | Ng | H01L 33/486 257/98 |
| 2012/0235287 | A1* | 9/2012 | Karim | H01L 33/486 257/676 |
| 2012/0262941 | A1 | 10/2012 | Min | |
| 2013/0049049 | A1* | 2/2013 | Choi | H01L 33/486 257/98 |
| 2013/0299854 | A1* | 11/2013 | Lee | H01L 33/62 257/88 |
| 2015/0340576 | A1* | 11/2015 | Itoh | H01L 25/0753 362/609 |

FOREIGN PATENT DOCUMENTS

| | | |
|---|---|---|
| DE | 102007008107 A1 | 9/2007 |
| DE | 102010045596 A1 | 3/2012 |
| EP | 1087447 A1 | 3/2001 |
| EP | 2207212 A2 | 7/2010 |
| GB | 2329238 A | 3/1999 |
| TW | M343242 U | 10/2008 |
| WO | 2006045897 A1 | 5/2006 |
| WO | 2007041877 A1 | 4/2007 |

OTHER PUBLICATIONS

"IR-Lumineszenzdiode (850 nm) mit hoher Ausgangsleistung; High Power Infrared Emitter (850 nm); Lead (Pb) Free Product—RoHS Compliant," OSRAM Opto Semiconductors, Data Sheet SFH 4556, Dec. 3, 2012, 7 pages.

"IR-Lumineszenzdiode (850 nm) mit hoher Ausgangsleistung; High Power Infrared Emitter (850 nm); Lead (Pb) Free Product—RoHS Compliant," OSRAM Opto Semiconductors, Data Sheet SFH 4258, Sfh 4259, May 21, 2012, 10 pages.

"IR-Lumineszenzdiode (850 nm) mit hoher Ausgangsleistung; High Power Infrared Emitter (850 nm); Lead (Pb) Free Product—RoHS Compliant," OSRAM Opto Semiconductors, Data Sheet SFH 4059, Oct. 11, 2012, 9 pages.

* cited by examiner

REFLECTO TROUGH FOR AN OPTOELECTRONIC SEMICONDUCTOR COMPONENT

This patent application is a national phase filing under section 371 of PCT/EP2013/076736, filed Dec. 16, 2013, which claims the priority of German patent application 10 2013 100 121.1, filed Jan. 8, 2013, each of which is incorporated herein by reference in its entirety.

TECHNICAL FIELD

An optoelectronic semiconductor component is provided.

SUMMARY

Embodiments of the invention provide an optoelectronic semiconductor component that displays a spatially narrow emission pattern.

According to at least one embodiment, the semiconductor component comprises a lead frame. The lead frame is configured for electrical contacting of the semiconductor component. For example, the lead frame is formed from a sheet metal semi-finished product.

According to at least one embodiment, the lead frame of the semiconductor component comprises two or more than two lead frame parts. In the semiconductor component, the lead frame parts are not connected directly together electrically, and therefore no short-circuit exists between the lead frame parts.

According to at least one embodiment, the semiconductor component contains one or more optoelectronic semiconductor chips. The at least one semiconductor chip is designed to generate electromagnetic radiation. For example, ultraviolet radiation, visible light or near infrared radiation is generated when the semiconductor chip is in operation. The semiconductor chip is preferably a light-emitting diode or also a laser diode. In addition to the optoelectronic semiconductor chip, further semiconductor chips or electronic components may be installed in the semiconductor component, for example, to provide protection from damage by electrostatic discharges or indeed to detect radiation, for instance a photodiode or a phototransistor.

According to at least one embodiment, the optoelectronic semiconductor chip is mounted on a first one of the lead frame parts. The semiconductor chip is preferably connected both mechanically and electrically with the first lead frame part.

According to at least one embodiment, the semiconductor component comprises a potting body. The potting body is transmissive for the radiation generated in the optoelectronic semiconductor chip. The potting body is preferably produced by means of pressing, casting and/or injection-molding. The potting body is preferably a one-piece body, with a material composition which is homogeneous within the bounds of manufacturing tolerances over the entire potting body.

According to at least one embodiment, the lead frame parts are joined together mechanically via the potting body. In other words, the potting body constitutes the component which mechanically supports and mechanically stabilizes the semiconductor component. The lead frame parts are anchored fixedly in the potting body, such that the lead frame parts do not become detached from or out of the potting body when the semiconductor component is used properly.

According to at least one embodiment, the potting body is configured for beam shaping of the radiation generated and emitted by the optoelectronic semiconductor chip. The potting body is preferably formed in places as a lens, in particular as a convergent lens. It is possible for absorbing and/or reflecting coatings to be mounted in sub-regions on the potting body. Alternatively, the potting body may however also be free of optically active coatings. The potting body may be provided at least in places with an antireflection coating.

According to at least one embodiment, the first lead frame part, on which the optoelectronic semiconductor component is arranged, comprises a reflector trough. The reflector trough has a base surface. The base surface may, within the bounds of manufacturing tolerances, be a plane, smooth surface. The semiconductor chip is preferably fastened to the base surface by means of adhesive bonding for instance with an electrically conductive silver adhesive or indeed by means of soldering.

According to at least one embodiment, the reflector trough comprises a circumferential surface. The circumferential surface is subdivided into three or into more than three sub-regions. The sub-regions in each case preferably completely surround the base surface when viewed in plan view onto the reflector trough. In other words, the sub-regions, when viewed in plan view, preferably take the form of continuous rings.

According to at least one embodiment, the sub-regions of the circumferential surface succeed one another, in particular directly, in a direction away from the base surface. A first sub-region is here located closest to the base surface and the bigger the number of a sub-region the further away from the base surface it is.

According to at least one embodiment, the first sub-region, which is closest to the base surface, is oriented perpendicular or substantially perpendicular to the base surface. Substantially perpendicular may mean that the circumferential surface is oriented in the first sub-region with a tolerance of at most 10° or with a tolerance of at most 5° or with a tolerance of at most 2° perpendicular to the base surface.

According to at least one embodiment, the first sub-region projects beyond the semiconductor chip in a direction away from the base surface. In other words, the optoelectronic semiconductor chip is completely surrounded by the first sub-region in a lateral direction. The optoelectronic semiconductor chip is then located in a type of bowl, formed by the base surface and the first sub-region. The semiconductor chip does not project above this bowl.

According to at least one embodiment, the circumferential surface has a different gradient in the second sub-region than the circumferential surface in the third sub-region. Particularly preferably, the gradient in the second sub-region is gentler than the gradient in the third sub-region. The gradient is here an angle to a perpendicular to the base surface, wherein a perpendicular is preferably related to a center point of the base surface, when viewed in plan view. The gradients of the second and third sub-regions are preferably different from 0° and from 90°. In a direction away from the base surface, a diameter of the reflector trough preferably increases monotonically or strictly monotonically.

According to at least one embodiment, the sub-regions transition into one another with a bend. In other words, within the bounds of manufacturing tolerances, an edge is formed between the sub-regions. The term edge may mean that a production-related radius of curvature amounts to at most 0.3 mm or at most 0.2 mm.

According to at least one embodiment, the semiconductor component is surface-mountable. The semiconductor component is thus an "SMT" component. This means that for electrical contacting the semiconductor component may be placed on a mounting surface. The lead frame parts do not penetrate the mounting surface.

In at least one embodiment, the optoelectronic semiconductor component comprises a lead frame with at least two lead frame parts and at least one optoelectronic semiconductor chip. The optoelectronic semiconductor chip is mounted on a first one of the lead frame parts and is designed to generate radiation. A radiation-transmissive potting body of the semiconductor component connects the lead frame parts together mechanically. The potting body is designed for beam-shaping of the radiation. The first lead frame part comprises a reflector trough with a base surface on which the semiconductor chip is mounted. The reflector trough further comprises a circumferential surface comprising at least three sub-regions. When viewed in plan view onto the base surface, the sub-regions surround the base surface and succeed one another in a direction away from the base surface. In the first sub-region, which lies closest to the base surface, the circumferential surface is oriented with a tolerance of at most 10° perpendicular to the base surface. The first sub-region preferably projects beyond the semiconductor chip in a direction away from the base surface. In the second sub-region, the circumferential surface has a gentler gradient than in the third sub-region. The sub-regions preferably transition into one another with a bend and/or directly. The semiconductor component is surface-mountable.

Conventionally, surface-mountable semiconductor components for generating in particular infrared radiation emit over a large solid angle range. The fraction of the radiation which is emitted at large angles, for example, at angles >50°, often cannot however be used for the desired application. Under certain circumstances this fraction of the radiation may also have negative effects on the application, for example, disturbance may be caused by scattered light. With the semiconductor component indicated, a large radiation fraction of the total optical power may be emitted in a small angular range.

The spatially narrow emission pattern is achieved in particular by the various sub-regions of the reflector trough, in particular in combination with the potting body shaped in a manner adapted thereto.

According to at least one embodiment, the first sub-region accounts for a proportion of at least 15% or at least 20% of the total height of the reflector trough. The total height here relates to an extent of the reflector trough beginning from the base surface and extending in a direction perpendicular to the base surface as far as an edge remote from the base surface of the most remote sub-region. Alternatively or in addition, this proportion accounted for by the first sub-region is at most 35% or at most 30% or at most 25%.

According to at least one embodiment, the second sub-region accounts for a proportion of the total height of the reflector trough of at least 20% or at least 25% or at least 30% or at least 35%. This proportion may alternatively or additionally be at most 60% or at most 55% or at most 50%.

According to at least one embodiment, the proportion of the total height of the reflector trough accounted for by the third sub-region is at least 20% or at least 25% or at least 30%. Alternatively or in addition, this proportion is at most 50% or at most 45% or at most 40%.

According to at least one embodiment, the proportion of the total height accounted for by the second sub-region is greater than the proportion of the third sub-region. For example, the proportion accounted for by the second sub-region amounts to at least 1.2 times or at least one 1.3 times the proportion accounted for by the third sub-region.

According to at least one embodiment, the gradients of the second and third sub-regions differ from one another by at least 3° or by at least 5° or by at least 7°. Alternatively or in addition, this difference is at most 25° or at most 20° or at most 15°.

According to at least one embodiment, the sub-regions, when viewed in a cross-section perpendicular to the base surface, each comprise straight surfaces. In other words, the sub-regions are each shaped as portions of a cone envelope or of a pyramid envelope, within the bounds of manufacturing tolerances. The first sub-region may also be shaped as a portion of a cylinder envelope. The sub-regions preferably do not comprise any curved surfaces, when viewed perpendicular to the base surface in cross-section.

According to at least one embodiment, the gradient of the second sub-region is at least 25° or at least 30° or at least 35°. Alternatively or in addition, this gradient is at most 50° or at most 45° or at most 40°. The gradient is here related to a perpendicular to the base surface.

According to at least one embodiment, the gradient of the third sub-region is at least 25° or at least 30° or at least 35°. Alternatively or in addition, this gradient is at most 45° or at most 40° or at most 50°.

According to at least one embodiment, a diameter or an average diameter of the base surface is at least 1.1 times or at least 1.2 times a length of a diagonal of a main radiation side of the semiconductor chip. The main radiation side is here preferably the side of the semiconductor chip remote from the base surface. It is possible for the diameter of the base surface to correspond to at most 1.7 times or at most 1.6 times or at most 1.5 times the diagonal length of the main radiation side.

According to at least one embodiment, the diameter of the base surface is at least 0.5 mm or at least 0.6 mm. Alternatively or in addition, this diameter is at most 1.0 mm or at most 0.85 mm or at most 0.75 mm.

According to at least one embodiment, the total height of the reflector trough amounts to at least 0.3 mm or at least 0.4 mm or at least 0.5 mm. Alternatively or in addition, the total height is at most 1.5 mm or at most 1.2 mm or at most 1.0 mm.

According to at least one embodiment, the total height of the reflector trough is at least twice or at least three times or at least four times the thickness of the lead frame.

According to at least one embodiment, the diameter of the base surface is greater than the total height of the reflector trough. For example, the diameter exceeds the total height by at least a factor of 1.05 or by at least a factor of 1.1 and/or by at most a factor of 1.8 or by at most a factor of 1.5.

According to at least one embodiment, the semiconductor chip is connected to the second lead frame part by an electrical connecting means. The connecting means comprises for example, a bonding wire. The connecting means may also be formed by a plurality of bonding wires or by an electrical bridge, in particular to provide protection against damage by electrostatic discharges.

According to at least one embodiment, the connecting means projects above the reflector trough. A height of the connecting means, calculated from the base surface and in a direction perpendicular to the base surface, then exceeds the total height of the reflector trough.

According to at least one embodiment, the circumferential surface of the reflector trough extends at a constant level and continuously around the base surface. In particular, the circumferential surface is free of recesses, cutouts or openings for the connecting means.

According to at least one embodiment, the potting body is formed as a lens, in particular as a convergent lens, in a region downstream of the reflector trough in a main emission direction of the semiconductor chip. It is possible for remaining regions of the potting body not to be formed as optically active components for the radiation generated in the semiconductor chip.

According to at least one embodiment, the lens is spaced from the lead frame. A distance, in the main radiation direction, between the lens and the lead frame amounts, for example, to at least 0.6 times or at least 0.8 times or at least 1.0 times the diagonal length of the main radiation side of the semiconductor chip. Alternatively or in addition, this distance is at most 2.4 times or at most 2.0 times or at most 1.8 times the diagonal length.

According to at least one embodiment, the lens comprises a peripheral region and a central region. When viewed in plan view, the peripheral region preferably surrounds the central region. The lens may be rotationally symmetrical in shape.

According to at least one embodiment, the lens is shaped in the central region as a sub-surface of a spheroid. A semi-major axis here corresponds, for example, to at least 1.5 times or at least 1.7 times a semi-minor axis of the spheroid and/or at most 2.5 times or 2.0 times. The semi-minor axis is preferably oriented parallel to the main emission direction of the semiconductor chip.

According to at least one embodiment, the lens is shaped conically in the peripheral region. In other words, the peripheral region comprises an outer boundary face which is a portion of a cone envelope.

According to at least one embodiment, a diameter of the central region is at least 0.7 times or at least 0.75 times a maximum diameter of the lens. Alternatively or in addition, the diameter of the central region is at most 0.9 times or 0.85 times the maximum lens diameter.

According to at least one embodiment, the central region, when viewed in plan view, completely covers the reflector trough. In other words, the diameter of the central region is then at least as great as the diameter of the reflector trough.

According to at least one embodiment, the height of the peripheral region is at least 1.5 times or at least 2.0 times the height of the central region. Alternatively or in addition, the height of the peripheral region is at most 3.5 times or at most 3.0 times the height of the central region. The heights are here understood in particular to be the extents of the corresponding regions in the main emission direction.

According to at least one embodiment, at least the circumferential surfaces of the reflector trough are provided in places or completely with a coating. The coating comprises one or more of the following materials or consists of one or more of these materials: Ag, Al, Au, Ni, Pd. The base surface is preferably provide with a solderable coating, for example, with or of at least one of the materials Au, Ni, Pd, Sn.

According to at least one embodiment, the lead frame is made from a copper alloy. The alloy preferably allows a strain of at least 3 or of at least 4 and/or at most 6. The strain is the quotient of a maximum height of the reflector and a thickness of the raw material. The maximum height of the reflector is made up of a thickness of the reflector trough at the base surface and the total height of the reflector trough. For example, the lead frame is formed from one of the following alloys: Cu-ETP, CU-Fe2P, CuCrSiTi, according to the EN designation.

According to at least one embodiment, the potting body is formed from an epoxide or an epoxide-silicone hybrid material.

According to at least one embodiment, an average thickness of the lead frame, in particular in regions outside the reflector trough, is at least 70 µm or at least 90 µm or at least 100 µm. This thickness may alternatively or additionally be at most 300 µm or at most 250 µm or at most 200 µm.

According to at least one embodiment, the potting body, when viewed in plan view onto the base surface, has external dimensions or an edge length of at most 6 mm or of at most 5 mm. Alternatively or in addition, a maximum extent of the potting body in the main emission direction may amount to at most 7 mm or at most 5 mm. It is possible for the potting body to be cuboid in shape, with the exception of the lens. Cuboid does not rule out the possibility of side faces deviating slightly from the cuboid shape, for example, with an angular tolerance of at most 15° or of at most 10°.

According to at least one embodiment, a maximum diameter of the reflector trough is 2.5 mm or 2.0 mm. The diameter of the reflector trough may amount to at least 0.8 mm or at least 1.0 mm.

According to at least one embodiment, the lead frame parts pierce the potting body or lateral boundary faces of the potting body towards the outside only in a direction perpendicular to the main emission direction, for example, with a tolerance of at most 15° or of at most 10° or of at most 5°. Points at which the lead frame parts pierce the lateral boundary face of the potting body are preferably surrounded by a material of the potting body.

According to at least one embodiment, only regions of the lead frame parts provided for electrical contacting project out of the potting body. In particular, the reflector trough may be completely surrounded by a material of the potting body. It is alternatively possible, for improved thermal contacting, for a base of the reflector trough to project out of the potting body or to terminate flush with the potting body.

According to at least one embodiment, the potting body directly surrounds and/or encloses the semiconductor chip. In other words, the potting body may be in contact with the semiconductor chip in places. In particular, the semiconductor chip is completely surrounded by the potting body together with the reflector trough. The semiconductor chip may, when viewed in plan view, adjoin the potting body at side faces all the way round, preferably directly.

BRIEF DESCRIPTION OF THE DRAWINGS

An optoelectronic semiconductor component described here is explained in greater detail below by way of exemplary embodiments and with reference to the drawings. Elements which are the same in the individual figures are indicated with the same reference numerals. The relationships between the elements are not shown to scale, however, but rather individual elements may be shown exaggeratedly large to assist in understanding.

In the drawings.

DETAILED DESCRIPTION OF ILLUSTRATIVE EMBODIMENTS

Figure 1A:
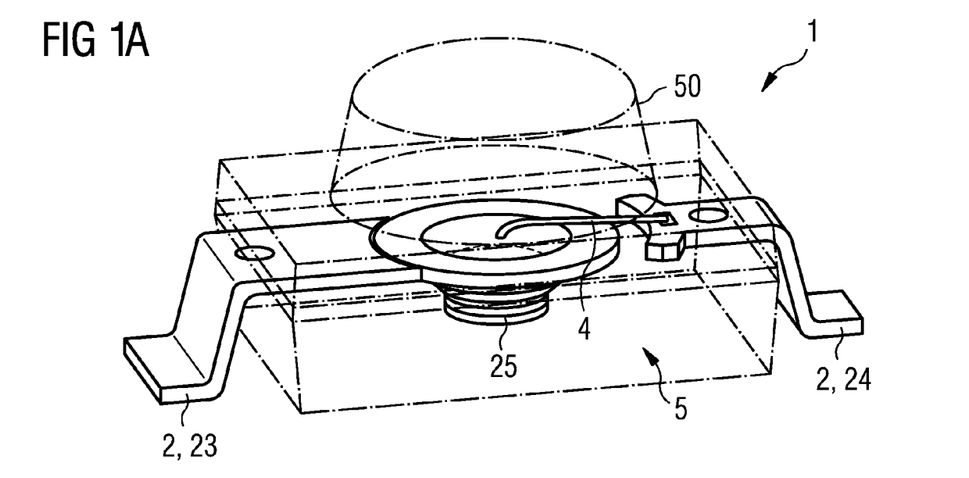
FIGS. 1A, 1B, 2A, 2B, 3A and 3B show schematic representations of exemplary embodiments of optoelectronic semiconductor components described here.
Figure 1B:
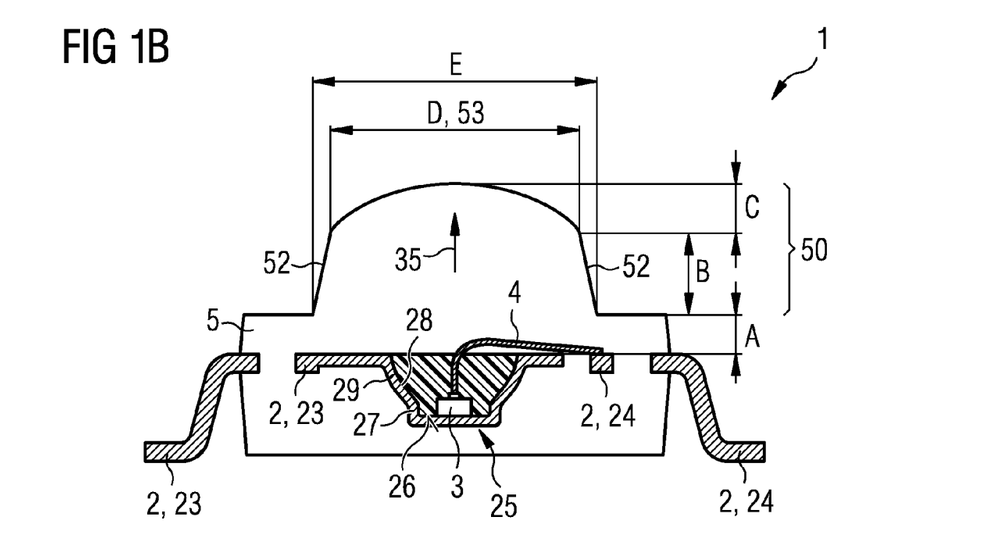

FIG. 1A shows a perspective representation and FIG. 1B a sectional representation of an exemplary embodiment of an optoelectronic semiconductor component 1. The semiconductor component 1 comprises a lead frame 2 with two lead frame parts 23, 24. The first lead frame part 23 comprises a reflector trough 25, in which an optoelectronic semiconductor chip 3 is mounted. The semiconductor chip 3 is, for example, a light-emitting diode, which emits radiation in the spectral range around 800 nm.

The semiconductor chip 3 is connected electrically with the second lead frame part 24 via a bonding wire 4. The bonding wire 4 extends out of the reflector trough 25 and over side walls of the reflector trough 25 to the second lead frame part 24.

In addition, the semiconductor component 1 contains a potting body 5. Directly around the lead frame 2, the potting body 5 is of approximately cuboid construction. In a region downstream in a main emission direction 35, the potting body 5 takes the form of a lens 50. For better anchoring of the lead frame 2 in the potting body 5, the lead frame parts 23, 24 comprise projections and/or holes.

The reflector trough 25 is shaped and matched to the lens 50 in such a way that a narrow spectral emission pattern of the semiconductor component 1 is achievable. To this end, a circumferential surface of the reflector trough 25, which surrounds the base surface 26, is subdivided into three sub-regions 27, 28, 29. The first sub-region 27 closest to the base surface 26 comprises surfaces oriented approximately perpendicular to the base surface 26 and facing the semiconductor chip 3.

The second sub-region 28 directly adjoins the first sub-region 27 and is provided with a gentler gradient compared with the third sub-region 29. The sub-regions 27, 28, 29 transition into one another approximately in the form of bends. The sub-regions 27, 28, 29, when viewed in the sectional representation according to FIG. 1B, are each produced with straight boundary faces facing the semiconductor chip 3.

The lens 50 is at a distance A from the lead frame parts 23, 24. The distance A amounts, for example, to at least 0.2 mm and/or at most 0.5 mm. The lens 50 comprises a central region 53 and a peripheral region 52. The peripheral region 52 is frustoconical in shape and completely surrounds the central region 53. A height B of the peripheral region 52, beginning from the cuboidally shaped part of the potting body 5, is for example, at least 0.6 mm and/or at most 0.9 mm. A height C of the adjacent central region 53 is, for example, at least 0.3 mm and/or at most 0.8 mm. A diameter D of the central region 53 amounts, for example, to at least 2.0 mm and/or at most 2.9 mm. A diameter E of the lens 50 at a transitional zone between the lens 50 and the cuboidal part is, for example, at least 2.2 mm and/or at most 3.1 mm.

The central region 53 takes the shape of a portion of an ellipse, when viewed in cross-section. The underlying ellipse has a semi-major axis of, for example, at least 2.1 mm and/or at most 2.4 mm. A semi-minor axis has, for example, a length of at most 1.4 mm and/or of at least 1.2 mm. The semi-minor axis is oriented parallel to the main emission direction 35.

The stated numerical values should in each case be understood merely by way of example and may be scaled to one another.

Unlike in the illustration, it is possible for the reflector trough 25 to be filled not with a material of the potting body 5, but rather with a further filling which is not shown, for example, with a silicone. In this further filling which is not shown, optically active constituents such as luminescent materials, scattering bodies or filter particles may be introduced. Likewise, unlike in the illustration, it is possible for the potting body 5, as also in all the other exemplary embodiments, to be produced by multicomponent injection molding. For example, the lens 50 is then formed from a radiation-transmissive material and the cuboid part from a non-radiation-transmissive material.

Figure 2A:
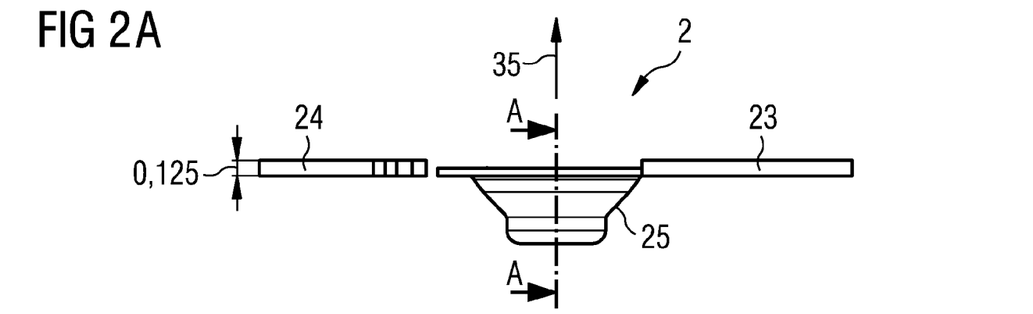
Figure 2B:
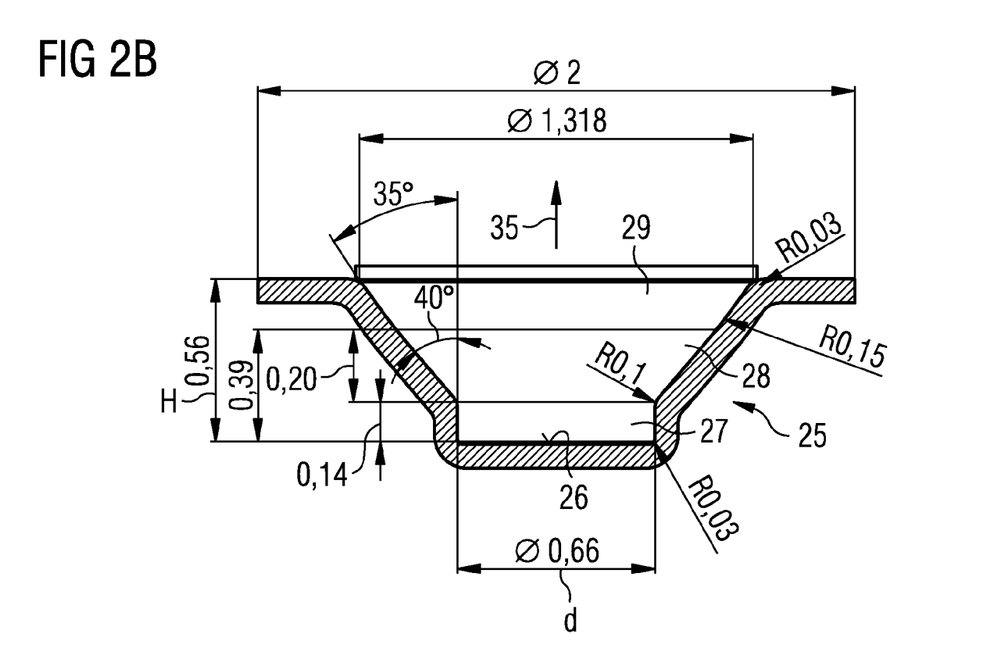
Figure 3A:
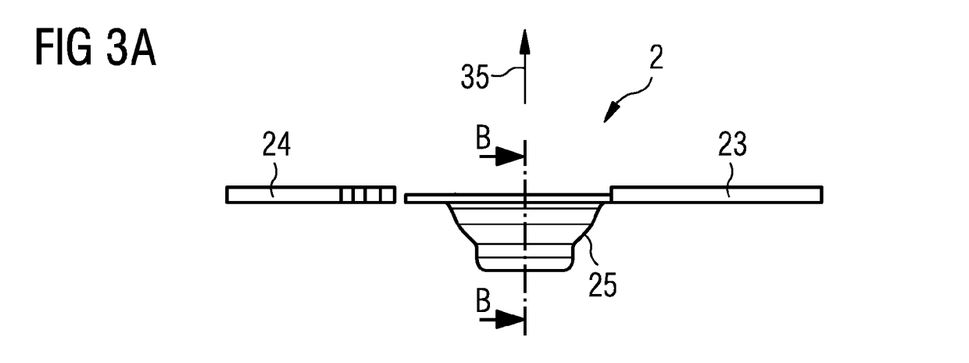
Figure 3B:
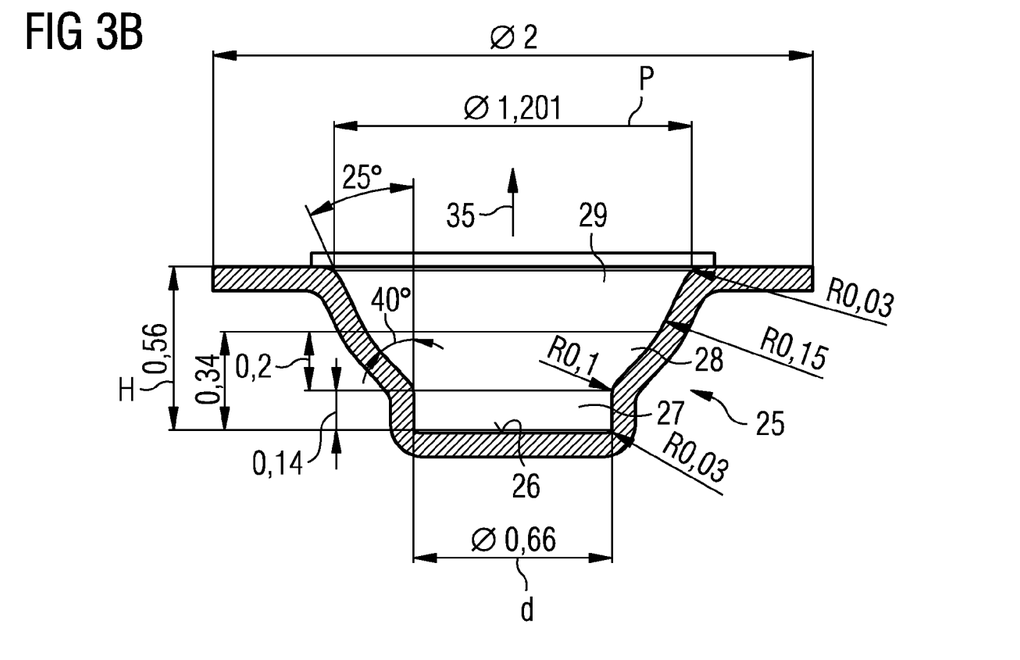

FIGS. 2 and 3 show more detailed views of reflector troughs 25 for optoelectronic semiconductor components 1 described here. FIGS. 2A, 3A each show a side view and FIGS. 2B, 3B each a sectional representation along the section line shown in FIGS. 2A and 3A. A potting body 5, as described for instance in relation to FIG. 1, may in each case be arranged downstream of the reflector troughs 25.

The reflector trough 25 according to FIG. 2 is configured for a spatially narrow emission pattern. To this end, the second sub-region 28 has a gradient of 40° and the third sub-region 29 a gradient of 35°. The majority of the radiation is emitted in an angular range of +/−10° around the main emission direction 35.

In the exemplary embodiment according to FIG. 3, the gradient of the second sub-region 28 is likewise 40°. The gradient of the third sub-region 29 is 25°. With the semiconductor component 1 according to FIG. 3, the majority of the radiation is emitted in a solid angle range of +/−20° around the main emission direction 35, cf. also FIG. 5. Majority may mean more than 50% or more than 70% or more than 80%.

The specific dimensions indicated in FIGS. 2 and 3 are scalable. The ratios shown between the individual dimensions have a tolerance of at most 5% or of at most 10%, irrespective of the absolute numerical values. For example, a ratio calculated from the total height H of the reflector trough 25 and the diameter d of the base surface 26 amounts to roughly 0.85, see FIG. 2B. The absolute values stated may, for example, apply within a factor of 2 or within a factor of 3, preferably taking account of the ratios between the individual dimensions. The same applies to FIG. 3.

Figure 4:
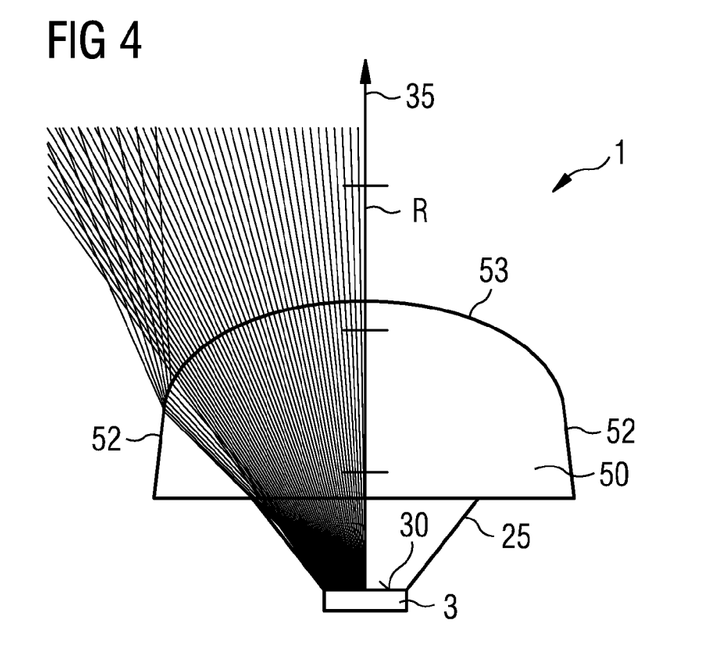
FIG. 4 is a schematic representation of an emission pattern of an optoelectronic semiconductor component described here.

FIG. 4 shows an emission pattern of the semiconductor component 1. Various pencils of rays R are shown, exiting from a main radiation side 30 of the semiconductor chip 3. As a result of the reflector trough 25, the radiation R is concentrated towards the lens 50. At the peripheral region 52, refraction takes place towards the main emission direction 35. At the central region 53, a relatively small change of direction of the radiation R takes place, since the radiation R impinges virtually perpendicularly onto the central region 53. In this case beam shaping is also substantially performed by the reflector trough 25.

Figure 5:
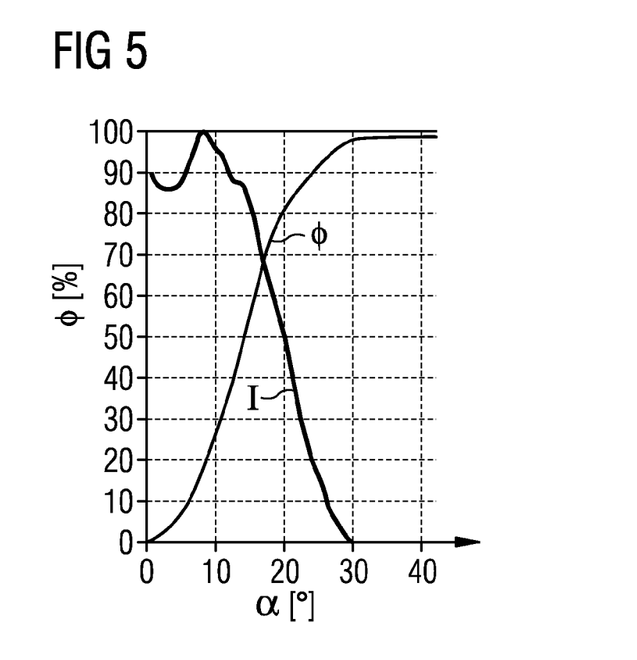
FIGS. 5 and 6 are schematic representations of emission patterns of semiconductor components.

In FIG. 5, a relative intensity I and a luminous flux Φ integrated over an angle α are plotted, as a function of an angle α to the main emission direction 35. Roughly 82% of the luminous flux Φ is emitted within an angular range of +/−20° around the main emission direction 35. An intensity maximum is at an angle of roughly 8°.

Figure 6:
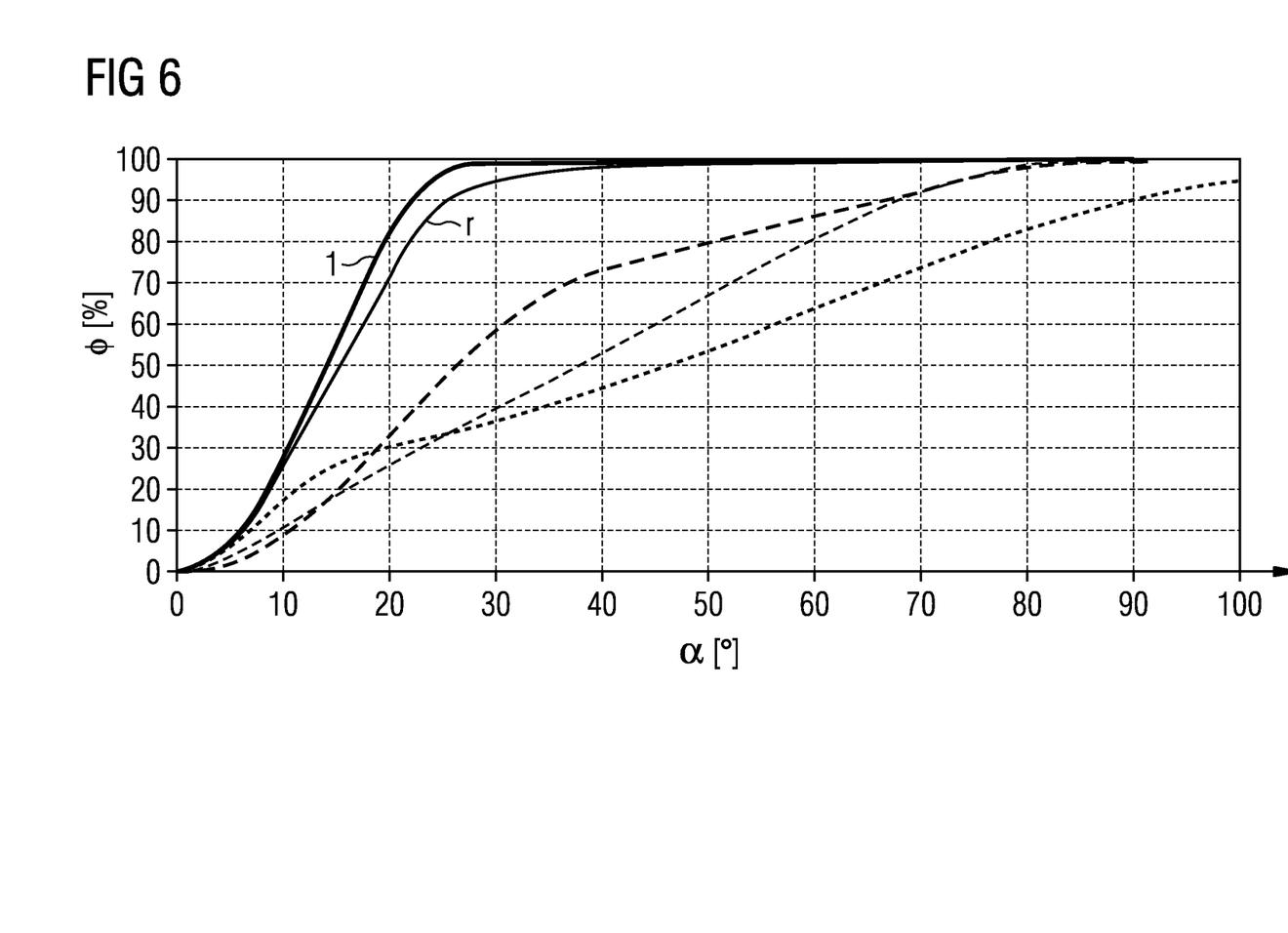

In FIG. 6, the luminous flux Φ, integrated over the angle α, is plotted for various configurations. The resultant curve for the semiconductor component 1 according to FIG. 3, cf. also FIG. 5, is labelled 1. A radial LED is labelled r. Typical, surface-mountable configurations are illustrated by the remaining three curves. FIG. 6 shows that, with the described geometry of the reflector trough 25 of the semiconductor component 1, it is possible to achieve a particularly narrow spatial emission pattern.

The invention described here is not restricted by the description given with reference to the exemplary embodiments. Rather, the invention encompasses any novel feature and any combination of features, including in particular any combination of features in the claims, even if this feature or this combination is not itself explicitly indicated in the claims or exemplary embodiments.

The invention claimed is:

1. An optoelectronic semiconductor component comprising:
   a lead frame with a plurality of lead frame parts;
   an optoelectronic semiconductor chip, mounted on a first one of the lead frame parts, the semiconductor chip for generating a radiation during operation; and
   a radiation-transmissive potting body that connects the lead frame parts together mechanically and is configured for beam-shaping of the radiation;
   wherein the first lead frame part comprises a reflector trough with a base surface, on which the semiconductor chip is mounted;
   wherein the reflector trough comprises a circumferential surface that comprises first, second and third sub-regions which, when viewed in plan view, surround the base surface and succeed one another in a direction away from the base surface;
   wherein in the first sub-region, which lies closest to the base surface, the circumferential surface is oriented with a tolerance of at most 10° perpendicular to the base surface;
   wherein the first sub-region projects beyond the semiconductor chip in a direction away from the base surface;
   wherein in the second sub-region, the circumferential surface has a gentler gradient than in the third sub-region;
   wherein the first and second sub-regions transition into one another with a bend;
   wherein the semiconductor component is surface-mountable; and
   wherein a diameter of the base surface is between 1.1 times and 1.7 times a length of a diagonal of a main radiation side of the semiconductor chip.

2. The optoelectronic semiconductor component according to claim 1, wherein:
   the first sub-region accounts for a proportion of a total height of the reflector trough of between 15% and 30% inclusive and the second sub-region accounts for a proportion of the total height of the reflector trough of between 25% and 55% inclusive and the third sub-region accounts for a proportion of the total height of the reflector trough of between 20% and 50% inclusive;
   a diameter of the base surface is greater than the total height of the reflector trough;
   the potting body is formed as a lens in a region downstream of the reflector trough in a main emission direction of the semiconductor chip, the lens comprising a peripheral region and a central region;
   the potting body directly surrounds the semiconductor chip and together with the reflector trough completely encloses it; and
   the lens is ellipsoidal in the central region and is conical in the peripheral region, such that a diameter of the lens reduces in the direction away from the semiconductor chip.

3. The optoelectronic semiconductor component according to claim 2, wherein the diameter of the base surface is between 0.5 mm and 2.0 mm inclusive and wherein the total height of the reflector trough is between 0.3 mm and 1.5 mm inclusive.

4. The optoelectronic semiconductor component according to claim 1, wherein:
   the first sub-region accounts for a proportion of a total height of the reflector trough of between 15% and 30% inclusive;
   the second sub-region accounts for a proportion of the total height of the reflector trough of between 25% and 55% inclusive; and
   the third sub-region accounts for a proportion of the total height of the reflector trough of between 20% and 50% inclusive.

5. The optoelectronic semiconductor component according to claim 1, wherein the gradients of the second and third sub-regions differ by at least 5° and at most 25°.

6. The optoelectronic semiconductor component according to claim 1, wherein the gradient of the second sub-region is between 30° and 50° inclusive, relative to a perpendicular to the base surface.

7. The optoelectronic semiconductor component according to claim 1, wherein the gradient of the third sub-region is between 25° and 45° inclusive, relative to a perpendicular to the base surface.

8. The optoelectronic semiconductor component according to claim 1,
   wherein the semiconductor chip is electrically conductively connected to a second one of the lead frame parts by a bonding wire; and
   wherein the bonding wire projects beyond the reflector trough and the circumferential surface extends continuously and at a constant height around the base surface.

9. The optoelectronic semiconductor component according to claim 1,
   wherein the potting body is formed as a lens in a region downstream of the reflector trough in a main emission direction of the semiconductor chip,
   wherein a distance along the main emission direction between this region in the form of a lens and the lead frame is between 0.6 times and 2.4 times inclusive the diagonal length of the main radiation side of the semiconductor chip.

10. The optoelectronic semiconductor component according to claim 9,
    wherein the lens comprises a peripheral region and a central region; and
    wherein the lens is ellipsoidal in the central region and is conical in the peripheral region.

11. The optoelectronic semiconductor component according to claim 10,
    wherein a diameter of the central region is between 0.7 times and 0.9 times a maximum diameter of the lens; and
    wherein the central region, when viewed in plan view, completely covers the reflector trough.

12. The optoelectronic semiconductor component according to claim 10, wherein a height of the peripheral region is between 1.5 times and 3.5 times a height of the central region.

13. The optoelectronic semiconductor component according to claim 1, wherein:
    the circumferential surfaces are provided at least in places, with a coating that comprises one or more of the following materials: Ag, Al, Au, Ni, Pd;
    the lead frame is made from a copper alloy and the potting body from an epoxide;
    the lead frame has an average thickness of between 90 μm and 300 μm inclusive; and
    the semiconductor chip is a light-emitting diode that emits in the red or near infrared spectral range.

14. The optoelectronic semiconductor component according to claim 1, wherein:
    the potting body, when viewed in plan view, has external dimensions of at most 6 mm;
    a maximum extent of the potting body in the main emission direction amounts to at most 7 mm;

a maximum diameter of the reflector trough is 2.5 mm;
the potting body is cuboid in shape, with the exception of the lens; and
the lead frame parts pierce the potting body towards the outside in a direction perpendicular to the main emission direction and are surrounded at a piercing point by a material of the potting body.

15. An optoelectronic semiconductor component comprising:
a lead frame with a plurality of lead frame parts;
an optoelectronic semiconductor chip, mounted on a first one of the lead frame parts, the semiconductor component for generating a radiation during operation, and
a radiation-transmissive potting body that connects the lead frame parts together mechanically and is configured for beam-shaping of the radiation;
wherein the first lead frame part comprises a reflector trough with a base surface, on which the semiconductor chip is mounted;
wherein the reflector trough comprises a circumferential surface that comprises first, second and third sub-regions which, when viewed in plan view, surround the base surface and succeed one another in a direction away from the base surface;
wherein, in the first sub-region, which lies closest to the base surface, the circumferential surface is oriented with a tolerance of at most 10° perpendicular to the base surface;
wherein the first sub-region projects beyond the semiconductor chip in a direction away from the base surface;
wherein, in the second sub-region, the circumferential surface has a gentler gradient than in the third sub-region;
wherein the sub-regions transition into one another with a bend; and
wherein the semiconductor component is surface-mountable.

16. The optoelectronic semiconductor component according to claim 15, wherein:
the first sub-region accounts for a proportion of a total height of the reflector trough of between 15% and 30% inclusive and the second sub-region accounts for a proportion of the total height of the reflector trough of between 25% and 55% inclusive and the third sub-region accounts for a proportion of the total height of the reflector trough of between 20% and 50% inclusive;
a diameter of the base surface is greater than the total height of the reflector trough;
the potting body is formed as a lens in a region downstream of the reflector trough in a main emission direction of the semiconductor chip, the lens comprising a peripheral region and a central region;
the potting body directly surrounds the semiconductor chip and together with the reflector trough completely encloses it; and
the lens is ellipsoidal in the central region and is conical in the peripheral region, such that a diameter of the lens reduces in the direction away from the semiconductor chip.

* * * * *

UNITED STATES PATENT AND TRADEMARK OFFICE
CERTIFICATE OF CORRECTION

| | | |
|---|---|---|
| PATENT NO. | : 9,318,678 B2 | Page 1 of 1 |
| APPLICATION NO. | : 14/653835 | |
| DATED | : April 19, 2016 | |
| INVENTOR(S) | : Andreas Wojcik | |

It is certified that error appears in the above-identified patent and that said Letters Patent is hereby corrected as shown below:

On the Title Page, Item (54) Title, line 1, delete "REFLECTO" and insert --REFLECTOR--.

Signed and Sealed this
Thirty-first Day of May, 2016

Michelle K. Lee
*Director of the United States Patent and Trademark Office*